US012813358B2

(12) United States Patent
Golz et al.

(10) Patent No.: US 12,813,358 B2
(45) Date of Patent: Nov. 24, 2026

(54) ORTHOGONAL INDUCTORS

(71) Applicant: International Business Machines Corporation, Armonk, NY (US)

(72) Inventors: John W Golz, Hopewell Junction, NY (US); John Knickerbocker, Monroe, NY (US); Mukta Ghate Farooq, Hopewell Junction, NY (US); Todd Edward Takken, Brewster, NY (US); Keiji Matsumoto, Yokohama (JP)

(73) Assignee: International Business Machines Corporation, Armonk, NY (US)

( * ) Notice: Subject to any disclaimer, the term of this patent is extended or adjusted under 35 U.S.C. 154(b) by 273 days.

(21) Appl. No.: 18/756,783

(22) Filed: Jun. 27, 2024

(65) Prior Publication Data

US 2026/0005206 A1 Jan. 1, 2026

(51) Int. Cl.
*H01F 27/28* (2006.01)
*H01F 27/24* (2006.01)
(Continued)

(52) U.S. Cl.
CPC ............ *H10W 90/00* (2026.01); *H01F 27/24* (2013.01); *H01F 27/2804* (2013.01); (Continued)

(58) Field of Classification Search
CPC ..... H10F 27/28; H10F 2027/065; H10F 27/24
See application file for complete search history.

(56) References Cited

U.S. PATENT DOCUMENTS 9,780,048 B1 10/2017 Berdy et al.
10,269,732 B2 4/2019 Yu et al.
(Continued)

FOREIGN PATENT DOCUMENTS

EP 1143517 A2 10/2001

OTHER PUBLICATIONS

O'Driscoll, S., "Recent Advances in Thin-Film Magnetics for Power Applications", PSMA Magnetics Committee Industry Session, https://www.psma.com/sites/default/files/uploads/node/6814/is016-recent-advances-thin-film-magnetics-power-applications.pdf, Printed on Jun. 27, 2024, 20 pages.
(Continued)

*Primary Examiner* — Errol V Fernandes
(74) *Attorney, Agent, or Firm* — Scully, Scott, Murphy & Presser, P.C.; Kristofer Haggerty

(57) ABSTRACT

An apparatus including a plurality of vertically oriented insulating substrates, each substrate having a planar surface including a looped metal coil structure forming a planar inductor. Each of the substrates and formed planar inductors arranged in parallel and oriented vertically and adjacent each other in a series configuration for increased inductance. The formed inductor and substrate disposed vertically with respect to a horizontal axis and is inclined at an angle with respect to a vertical axis, the angle ranging between less than 90 degrees and greater than 0 degrees. A first magnetic material plate is disposed adjacent the planar inductor at a first planar surface of the substrate, and a second magnetic material plate disposed adjacent a second planar surface having a conductive trace connecting one end of the planar inductor, each first and second plate extending to limit a spatial extent of the magnetic fields created by the inductor.

20 Claims, 8 Drawing Sheets

(51) Int. Cl.

| | |
|---|---|
| ***H01F 27/29*** | (2006.01) |
| ***H10D 1/20*** | (2025.01) |
| ***H10D 1/68*** | (2025.01) |
| ***H10W 40/22*** | (2026.01) |
| ***H10W 90/00*** | (2026.01) |

(52) U.S. Cl.

CPC ............... *H01F 27/29* (2013.01); *H10D 1/20* (2025.01); *H10D 1/692* (2025.01); *H10W 40/22* (2026.01); *H01F 2027/2809* (2013.01); *H10W 90/728* (2026.01)

(56) References Cited

U.S. PATENT DOCUMENTS

| | | | |
|---|---|---|---|
| 10,354,950 | B2 | 7/2019 | Sturcken et al. |
| 10,490,349 | B2 * | 11/2019 | Lee ..................... H01F 17/0013 |
| 11,456,262 | B2 * | 9/2022 | Sato ...................... H01F 27/027 |
| 2008/0204183 | A1 | 8/2008 | Loza |
| 2021/0384122 | A1 * | 12/2021 | Leng .................. H01F 17/0006 |
| 2022/0012275 | A1 | 1/2022 | Patel et al. |
| 2022/0122756 | A1 | 4/2022 | Wolter et al. |
| 2022/0328237 | A1 | 10/2022 | Li et al. |
| 2024/0006259 | A1 * | 1/2024 | Inoue ........................ H01F 1/28 |

OTHER PUBLICATIONS

Restle, P., “Processor Clock Generation, Distribution, and Clock Sensor/Management Loops”, ISSCC 2021, Feb. 18, 2021, 134 pages.

* cited by examiner

ORTHOGONAL INDUCTORS

BACKGROUND

This disclosure relates generally to semiconductor devices, and more specifically to inductor and capacitor device structures, e.g., air/dielectric/magnetic inductors and capacitors, formed to lie at an angle relative to a functional chip either above or below the chip, such as on a substrate, interposer or laminate.

Typically, inductors and capacitors devices are fabricated on a Si chip and typically a dielectric layer is necessary between the Si substrate structure and all the components. In current memory chips conventional in-plane inductors occupies more than 50% of the Si in-plane area or the chip area.

SUMMARY

Embodiments of the present disclosure provide a structure in which an inductor element(s) is(are) placed at an angle relative to a functional chip or chiplet (or chip stack/chiplet stack) above or below it.

In one aspect, the inductor(s) is(are) placed at an angle relative to and adjacent to the functional chip or chiplet (or chip stack/chiplet stack).

In one aspect, an inductor that is placed at an angle relative to and adjacent to the functional chip or chiplet occupies is less than 50% of the area occupied by the equivalent in-plane inductor.

Further to this aspect, inductance is significantly larger, because multiple inductors can be placed at an angle in the same area. In this aspect, power delivery and/or signal delivery between inductors is permitted.

Further to this aspect, inductors at an angle relative to an in-plane functional chip support clocking on functional chips, power rails on functional chips, voltage regulations and buck converters.

Further to this aspect, inductors at a vertical angle relative to an in-plane functional chip allows flexible tradeoff of volume (and/or height) versus dimensional area for magnetic elements.

According to an aspect of the present disclosure, there is provided an apparatus comprising: an insulating substrate having an edge and a first planar surface; a looped planar metal coil forming an inductor on the first planar surface, the inductor coil having opposite ends, each opposite end of the looped metal inductor coil having a respective conductive wire trace extending to an edge of the insulating substrate; a horizontally planar-oriented integrated circuit (IC) chip or chiplet having conductive connective pads; and each the conductive wire trace of the insulating substrate edge adapted to electrically connect to a respective connective pad via a conductive connector, wherein the insulating substrate and formed inductor thereon is disposed vertically with respect to the horizontally planar-oriented IC chip and is inclined at an angle with respect to a vertical axis, wherein the angle ranges between less than 90 degrees and greater than 0 degrees.

According to a further aspect, there is provided an apparatus. The apparatus comprises: a laminate structure having a surface for mounting integrated circuits; a cavity formed in the laminate structure, the cavity having an opening at the surface of the laminate: a horizontally planar-oriented IC chip or chiplet mounted on the laminate, the mounted IC chip or chiplet having a portion disposed above the cavity including an underside surface having one or more exposed conductive connector structures that connect to circuitry in the IC chip or chiplet; one or more insulating substrates disposed in the cavity; and one or more inductors formed on a surface of the insulating substrate, each inductor comprising a looped planar metal coil formed on a surface of the insulating substrate; each metal coil inductor comprising opposite ends, each opposing end of the looped metal inductor coil having a respective conductive wire trace extending to an edge of the insulating substrate, wherein the conductive wire trace of a respective the insulating substrate edge electrically connects to a respective conductive connector structure of the mounted IC chip or chiplet at the underside surface thereof, wherein the insulating substrate and formed inductor thereon is disposed vertically with respect to the horizontally planar-oriented IC chip and is inclined at an angle with respect to a vertical axis, wherein the angle ranges between less than 90 degrees and greater than 0 degrees.

According to a further aspect, there is provided a three-dimensional semiconductor device structure. The semiconductor device structure comprises: a top horizontal planar-oriented logic chip or chiplet having one or more conductive bump connectors on an underside surface thereof, a plurality of insulating substrates having a planar surface upon which is formed one or more planar looped metal coil inductors, each of the plurality of insulating substrates having the formed inductors oriented vertically and arranged in parallel and adjacent each other in a series configuration, wherein each looped planar metal coil inductor comprises opposite ends, each opposing end of the looped metal coil inductor having a respective conductive wire trace extending to a top edge of the insulating substrate; and a respective wire trace at a surface edge of the insulating substrate electrically connecting to a corresponding conductive bump structure formed at the underside surface of the top horizontal planar-oriented logic chip or chiplet for connecting to a circuit within the top horizontal planar-oriented logic chip or chiplet, wherein each inductor is formed on a respective insulating substrate is disposed vertically with respect to the horizontally planar-oriented logic chip and is inclined at an angle with respect to a vertical axis, wherein the angle ranges between less than 90 degrees and greater than 0 degrees.

Further features, as well as the structure and operation of various embodiments, are described in detail below with reference to the accompanying drawings. In the drawings, like reference numbers indicate identical or functionally similar elements.

DETAILED DESCRIPTION

Figure 1B:
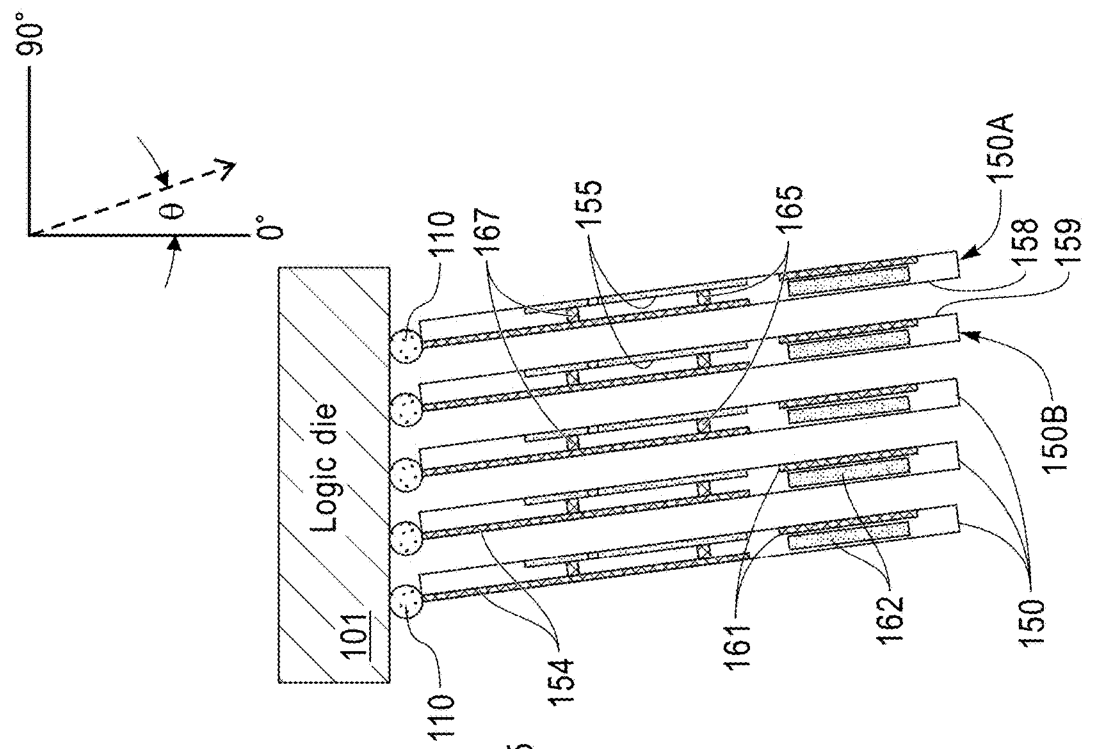
FIG. 1B depicts a side cross-sectional view of a structure taken along line A-A of FIG. 1A.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1A:
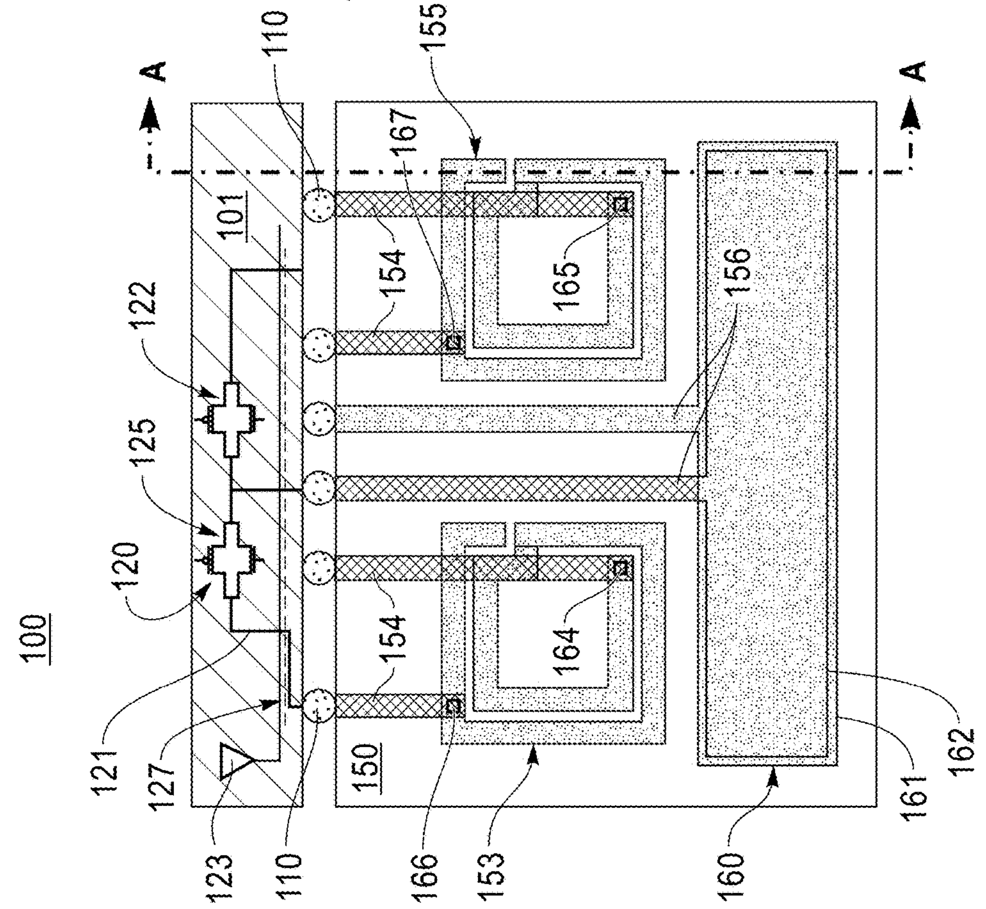
FIG. 1A diagrammatically illustrates a chip layout including a logic chip and an electrically connected inductor and capacitor device disposed on an insulating substrate, e.g., a glass chip that is oriented at an angle relative to the logic chip according to embodiments of the present application.

Referring to FIG. 1A, there is illustrated a chip structure and layout 100 including a logic chip 101 and an electrically connected inductor and capacitor device disposed on an insulating substrate 150 such as a glass chip, a silicon (Si) chip or substrate or "slice" that is oriented at an angle relative to the logic chip according to embodiments of the present application. As shown in FIG. 1B, depicting a side cross-sectional view taken along line A-A of FIG. 1A, each glass chip 150 is oriented at a vertical angle "θ" that ranges from between 0° and 90° (i.e., 0°<θ<90°). In an embodiment, the angled inductor formed on the substrate can be made of dielectric or air or magnetic material and made on glass or dielectric oxide material chip or an active or passive Silicon-containing substrate or slice. Alternatively, the angled (or inclined) inductors can be made on a Silicon chip, slice, substrate or other high thermal conductivity substrate when the thermal management is prioritized.

As shown in FIG. 1A, there is depicted an example front-cross-sectional view of the chip structure and layout 100 including a top planar-oriented chip or logic die 101 including circuitry such as clocking circuitry 120 including a clock or like-on-chip oscillator (not shown) that connects to one or more clock stripes of sector buffers 123, each stripe having connected a column of rows of global buffers for a global clock network. The circuit 120 in top chip (or logic die) 101 include conductors 121 that connect to one or more inductors and capacitors on the glass substrate 150 via conductive pads or connectors such as C4 or like Cu or Pb/Sn solder bumps 110. As shown in FIG. 1A, these top chip circuit conductors 121 are shown connecting respective low frequency (LF) switch(es) 122 and high frequency (HF) switch(es) 125 of a clock mesh circuit 127 to a corresponding respective low-frequency angled $L_{LF}$ inductor element 155 and a high-frequency $L_{HF}$ inductor element 153 formed on the glass substrate 150 (or glass chip) that is oriented vertically at an angle with respect to the horizontal layout of the top chip 101. Additionally, top chip circuit conductors 121 further connect to a decoupling capacitor $C_{decap}$ 160 having first capacitor plate 161 and second capacitor plate 162 formed on the angled glass chip 150 according to an embodiment. It is further understood that for non-limiting purposes of illustration, the use of angled functional logic die provides support for a global clocking network circuitry at the logic die. However, it is understood that inductors support clocking on functional chips, power rails on functional chips, or can be used to provide voltage regulation or use as a buck converter.

According to an aspect of the present disclosure, the inductor and capacitor components that connect to top chip circuitry 120 are formed on a glass chip 150 according to separate fabrication processes used to form the top chip.

Particularly, as shown in FIG. 1A, each respective high-frequency $L_{HF}$ inductor element 153 and the low-frequency $L_{LF}$ inductor element 155 consist of conductive wires mounted on a surface of the glass chip that are connected to form a looped, planar, multi-turn coil structure forming an inductor having round corners and two ends (or completely circular windings). The conductor wiring forming the planar inductor element 153, 155 can be shaped into loops with an inductor having anywhere from between two (2) loops to six (6) loops and two end connections. Each of the two ends of each respective formed high-frequency $L_{HF}$ inductor element 153 and the low-frequency $L_{LF}$ inductor element 155 connect to respective two solder bumps 110 via respective conductive leads, traces or wires 154 formed on the glass chip 150. Each of the respective wire leads 154 connecting to a respective end of the high-frequency $L_{HF}$ inductor element 153 and the respective ends of the low-frequency $L_{LF}$ inductor element 155 are formed on the glass chip 150 are shown oriented in parallel with respect to each other and connect to the logic die 100 via corresponding under-bump metallurgy such as conductive pads and solder bump structures 110. Further shown formed on glass chip 150 are respective separate parallel oriented conductive leads or wires 156 connecting a respective first capacitor plate 161 and second capacitor plate 162 of a decoupling capacitor $C_{decap}$ 160 to the logic die 101 via corresponding conductive pads and corresponding solder bump structures 110.

Thus, as shown in FIG. 1A, the logic die 101 circuitry 120 include a layout of solder bumps or pads 110 for connection to the built components of the glass chip substrate 150 that is oriented at an angle (less than but greater than 0°) relative to the horizontal oriented plane of the logic die 101. As further shown in FIG. 1A, one end of the $L_{HF}$ inductor element 153 includes a conductive via connection 164 extending through the substrate to connect to one of the parallel wire lead 154 while the other end of the $L_{HF}$ inductor element 153 includes a conductive via connection 166 extending through the substrate to connect to another one of the parallel wire leads 154. Similarly, one end of the $L_{LF}$ inductor element 155 includes a conductive via connection 165 extending through the substrate to connect to one of the parallel wire lead 154 while the other end of the $L_{LF}$ inductor element 155 includes a conductive via connection 167 extending through the substrate to connect to another one of the parallel wire leads 154.

FIG. 1B shows a cross-sectional view of the logic die 101 and glass chip(s) 150 taken along line A-A of FIG. 1A. In the embodiment depicted in FIG. 1B, the top planar-oriented chip or logic die 101 including the exemplary low frequency switches and high frequency switches of an example global clock network circuitry (of FIG. 1A) are shown electrically connected to the inductor and capacitor circuit elements formed on each glass chip substrate 150, with each glass chip substrate 150 including the formed $L_{HF}$ inductor element 153, $L_{LF}$ inductor element 155 inductor and the decoupling capacitor $C_{decap}$. As shown in the cross-sectional view of FIG. 1, taking a first glass chip 150A, there is shown on one top planarized surface of the glass chip the conductive wires forming the multi-turn, looped planar inductor element, e.g., formed low-frequency $L_{LF}$ inductor element 155.

Further, as shown in the side, cross-sectional view of FIG. 1B, there is shown formed at a back surface 158 of the glass or Si substrate 150A or embedded within the glass substrate at least the lead line 154 that is extended to and exposed at a top planarized edge surface of the glass substrate and that electrically connect to a first end of the formed inductor 155 using a formed conductive via connector 167. The other lead line (not shown) is disposed in parallel behind the lead line 154 to connect the second end of the formed inductor 155 to top chip 101 using a formed conductive via connector 165. It is understood that optionally, both lead lines 154 can be embedded in an internal layer of the glass substrate. Although not shown in FIG. 1B, it is understood that, similarly formed at or near the top surface of the first glass chip 150A is the formed high-frequency $L_{HF}$ inductor element (not shown) and at or near the opposing surface 158 of the glass chip 150A are the formed two wire leads (not shown) electrically connecting the respective two ends of the high-frequency $L_{HF}$ inductor element (not shown) on the first glass chip with respective conductive vias (not shown) extending from the respective end portions of the inductor element formed on the glass chip 150A to connect with the respective two wire leads. As better shown in FIG. 2C, in an embodiment, there are formed under-bump metal connections 110 that contact an exposed surface of the wire leads.

Further, as shown in the side, cross-sectional view of FIG. 1B, additionally shown formed on or near one surface of the glass chip 150A the conductive structures forming the first and second capacitor plates 161, 162 of the decoupling capacitor 160. In an embodiment, the capacitor plates may be separately manufactured and inserted into an opening or hole formed in the surface of the substrate 150 or can be externally mounted at a surface of the substrate. The capacitor plates can be fabricated with a dielectric material between plates. Although not shown in FIG. 1B, the formed first and second capacitor plates 161, 162 connect with a respective parallel oriented lead line (not shown) that is also formed at or embedded near one surface of the glass chip 150A and brought out to a top surface or top planarized edge of the glass substrate and that electrically connect to logic die circuitry 120 via respective solder bump 110. As shown in FIG. 1B, the glass substrate 150A and inductor and capacitor elements are oriented vertically but inclined at an angle with respect to the orthogonal.

As shown parallel to and adjacent to the angled first glass chip 150A is a second angled glass chip 150B, having a top surface 159 facing a back surface 158 of the adjacent angled, first glass chip 150A and separate by a short distance therewith. As in first glass chip 150A, similarly disposed on this surface 159 of glass chip 150B are conductive wires forming the looped, multi-turn, planar inductor element, e.g., $L_{LF}$ inductor element 155 and additionally the conductive structures forming capacitor plates 161, 162 of a decoupling capacitor 160. Further, as shown in the side, cross-sectional view of FIG. 1B, there is shown embedded within the glass substrate 150B is at least the lead line 154 that is brought out to a top surface or top planarized edge of the glass substrate and that electrically connect to a first end of the formed inductor 155 using a formed conductive via connector 167. The other lead line (not shown) is disposed in parallel behind the lead line 154 to connect the second end of the formed inductor 155 to top chip 101 using a formed conductive via connector 165. Further, although not shown in the side, cross-sectional view of FIG. 1B, embedded within or at the back surface of the glass substrate 150B is the corresponding parallel lead lines or like conductive structures connecting the respective first and second capacitor plates 161, 162 of the decoupling capacitor 160 that are also brought out to a top surface or top planarized edge surface of the glass substrate and that electrically connect to logic die circuitry 120 via respective solder bumps 110. As shown in FIG. 1B, the glass substrate 150B is oriented vertically and inclined at the same angle as glass substrate 150A.

It is understood that embodiments of the disclosure contemplate multiple glass chips 150 oriented at an angle and substantially in parallel with each other. While only two inductors and a decoupling capacitor are shown formed at a respective glass chip, it is understood that the glass chip circuitry is not limited to these elements, and that other elements can be formed including additional inductors and capacitor elements. In such a chip layout and physical angled orientation of the glass chips, significantly increased total inductance can be achieved because multiple inductors are placed in the same area. Further, multiple voltages from independent inductors can be supplied to the chip or chiplets. Further, power delivery and signal delivery between inductors is permitted. Moreover, the formed inductors can be made on Si or other high thermal conductivity substrates when the thermal management is prioritized. Furthermore, the formed planar inductors can be bonded to each other by adhesive and/or solder interconnect or Cu Hybrid Bonding. The inductors can be bonded to each other using a high thermal conductivity adhesive and/or thermal interconnects (solder interconnect or Cu Hybrid Bonding) when the thermal management is prioritized.

Further, in the embodiment depicted in FIGS. 1A, 1B and in the further embodiments herein, although the glass substrate is disposed at an angle relative to the vertical, the inductor height on the substrate can be optimized, e.g., such as for prioritizing a signal delivery. Further, the total area occupied by the angled substrates/inductors is less than 50% of the area occupied by an equivalent in-plane inductor. In an illustrative, non-limiting embodiment, the dimension of the planar multi-turn, coil-shaped inductor structures 153, 155 having round corners and two ends can range anywhere from between 100 microns and 150 microns in diameter and can have 2×-6× loops or more loops (e.g., >10 loops). For example, the inductor can be 125 microns in diameter, and with either 2×-6× loops can provide the equivalent of 2×-6× more inductance per unit area.

Further, although not shown, additional electric conductors in the logic die can be configured to provide power delivery and signal delivery between inductors. In a further embodiment, additional angled (glass) substrates can provide current and signal connections and electrical and magnetic shielding. In this case, the power and current substrates could be inserted between the angled inductor substrates, i.e., signal, current and shielding structures can be provided on separate, interspersed substrates.

In the embodiments depicted herein, the size, the spacing, the architecture, and the functional blocks, are optimized, along with the angled substrates with inductor structures for effective power delivery and Q factor, inductor quality, to support the power requirements of the targeted architecture in a 2D chip/3D stacked chips (e.g., vertically stacked transistors).

Figures 2A, 2B, 2C:
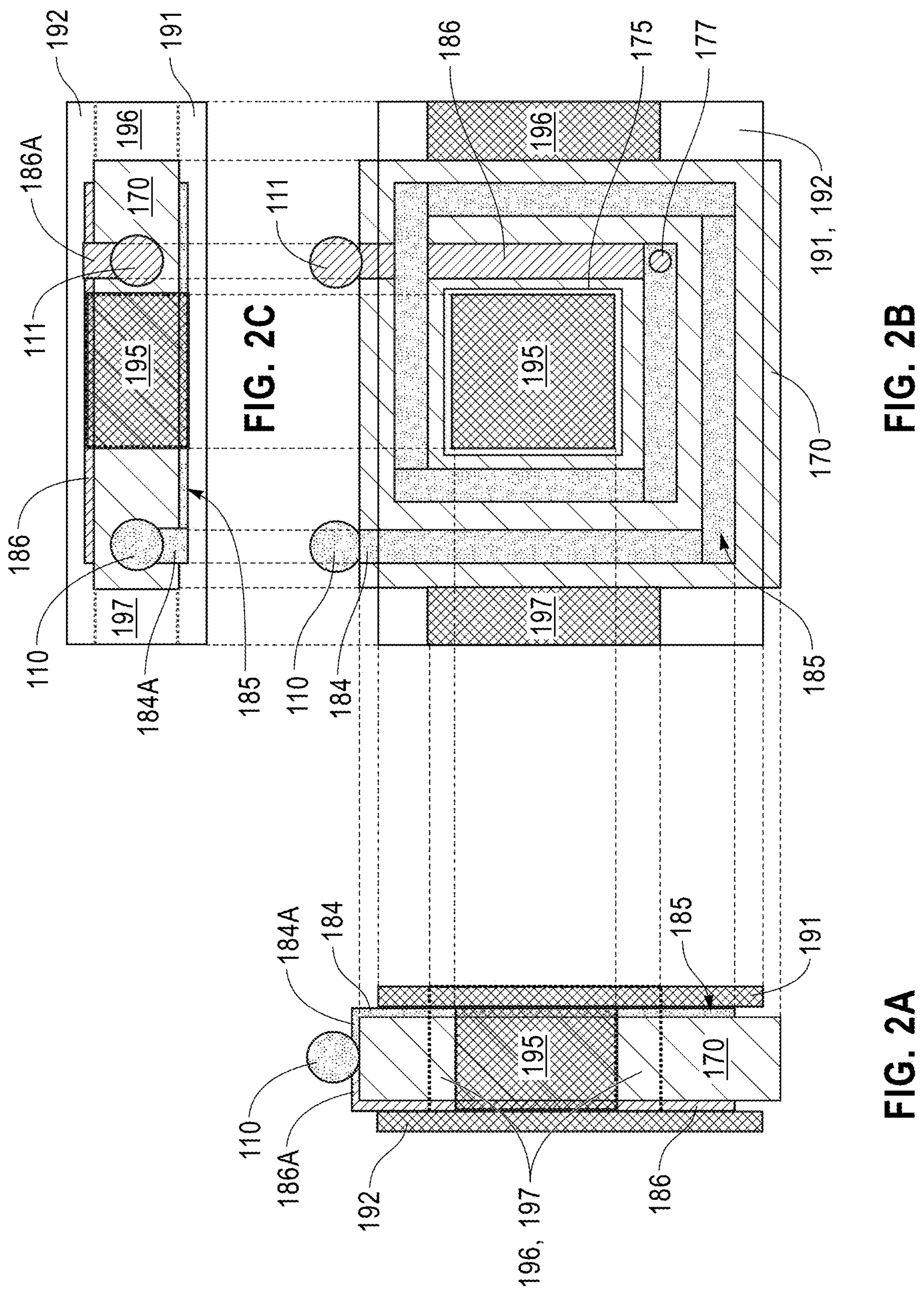
FIGS. 2A-2C depict a further embodiment of an inductor device disposed on a planar surface of the substrate such as a glass chip that incorporates one or more planar sheets of magnetic material located adjacent to the plane of the windings of the inductor.

FIGS. 2A-2C depict a further embodiment of an inductor device 185 disposed on a planar surface of the substrate such as a glass chip 170, or similar substrate or "slice" that is adapted for electrical connection to a logic chip (not shown) and that incorporates one or more planar sheets of magnetic material located adjacent to the plane of the windings of the inductor. In one embodiment, FIGS. 2A and 2B depict a respective end view and side view of a glass substrate 170 having formed on a first surface a multi-loop, serpentine or coiled shaped conductor or wire, e.g., of a copper material, that forms an inductor 185 having two ends. In particular, the conductor wire of the inductor is shaped into loops with the inductor having anywhere from between two (2) loops to six (6) loops and two end connections. The inductor 185 includes a first metal wire portion or trace 184 that extends on the first planar surface to a top edge surface of the glass chip or substrate and that forms one end of the inductor that electrically connects to a first pad or solder bump or ball 110 formed on the top substrate edge. Further, as shown in the side, cross-sectional view of FIG. 2B, there is shown a formed connecting conductive metal via or post 177 extending through the glass chip 170 that electrically connects the inductor wire 185 at an opposing end to a second metal wire or trace 186 formed on the opposing planar surface of the glass substrate 170. This second metal wire or trace 186 forms a part of the inductor 185 and extends on the opposing or second surface of the glass substrate to the top edge surface of the glass chip or substrate 170 and that forms the second inductor end that can electrically connect to a second pad or solder bump or ball 111 formed on the top substrate edge.

More particularly, as shown in the view of FIGS. 2A and 2C depicting respective side cross-sectional view and top edge view of glass substrate 170, the first metal wire portion or trace 184 that forms one part of the inductor 185 and extends to the top edge surface of the glass chip electrically connects to the first solder bump or ball 110 formed on the top substrate edge via a further formed connective conductive structure 184A overlying the top edge of the glass substrate. Similarly, the second metal wire or trace 186 that forms a second part of the inductor 185 and extends to the top edge surface of the glass chip 170 electrically connects to the second pad or solder bump or ball 111 via a further connective conductive structure 186A overlying the top edge of the glass substrate.

Further in FIGS. 2A-2C, there is depicted one or more magnetic sheets or plates 191, 192 formed of a ferrite or like magnetic material (e.g., ceramic or sintered (high temperature) magnetic material) that sandwich the insulting or glass substrate, with first magnetic material plate 191 abutting one planar surface of the glass chip including the metal conductor forming inductor 185 and a second magnetic material plate 192 abutting the formed a conductor wire or trace 186 (or another inductor coil) on the opposing planar surface of the glass chip. Additional magnetic posts 196, 197 formed of a ferrite or like magnetic material sandwich portions of both side edges of the glass chip 170. In this embodiment, the glass chip 170 further includes an opening 175 formed in an area corresponding to the area defined by the innermost loop of the looped coil wire of inductor 185. In this area 175 is disposed a magnetic post 195 that substantially fills the formed opening 175 and extends wholly through the inductor 185 between the opposing planar surfaces of the glass chip perpendicular to the plane of the inductor's windings. As shown in the top view of FIG. 2C, the magnetic plates 191, 192, magnetic material posts 196, 197, and inner magnetic post 195 all contact each other and can form a loop about the inductor element on the glass substrate 170. In an embodiment, the interior magnetic posts, exterior magnetic posts and adjacent magnetic planar sections together form one or more loops of magnetic material that encircle the path of current through the inductor windings and wherein this loop of magnetic material increases the inductance of the inductor relative to a similar inductor structure having no magnetic material. In an embodiment, one or more discrete or distributed magnetic gaps in the loop of magnetic material is used can be used to adjust the trade-off between the inductor's magnetic saturation current and its inductance value.

Figure 3:
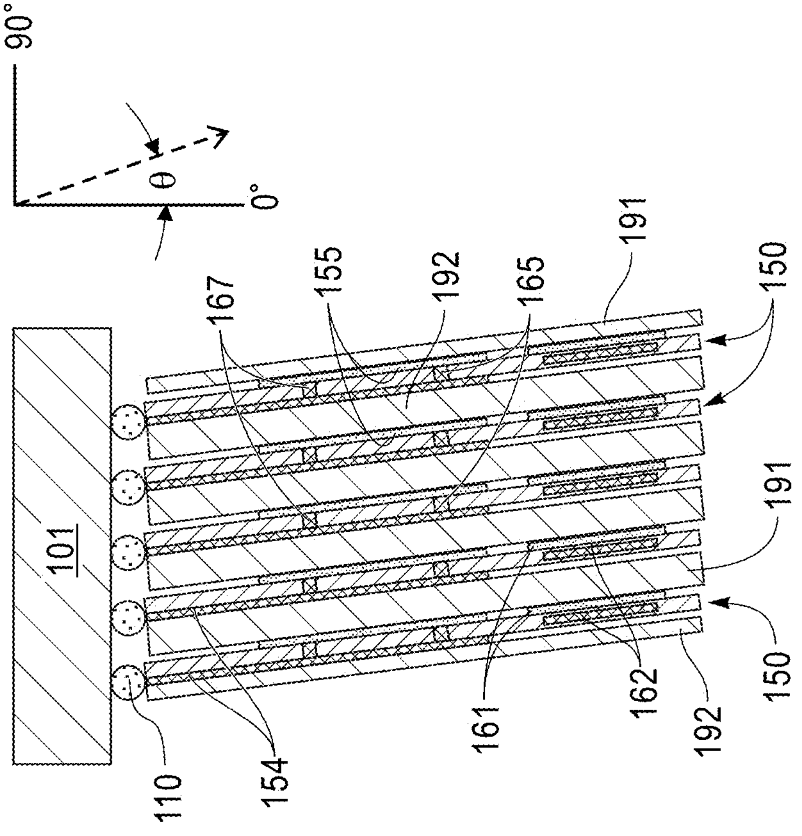
FIG. 3 shows a side, cross-sectional view of the logic die of FIG. 1A and multiple attached glass chip(s) that correspond to the glass chip formed in FIGS. 1A, 1B having inductors, capacitor and all conductive lead lines formed thereon, however further including provision of magnetic plates adjacent planar surfaces thereof as shown in FIGS. 2A-2C.

FIG. 3 shows a side, cross-sectional view of the logic die 101 of FIG. 1A and multiple attached glass chip(s) 150 that correspond to the glass chip formed in FIGS. 1A, 1B having inductors 153, 155, capacitor 160 and all conductive lead lines formed thereon, however further including provision of magnetic plates formed on surfaces thereon as shown in FIGS. 2A-2C. In the embodiment depicted in FIG. 3, the top planar-oriented chip or logic die 101 is shown electrically connected to the inductor 155 and capacitor 160 circuit elements formed on each glass chip substrate 150 that extend downward therefrom at an angle θ ranging from between 0° and 90°. As shown in the cross-sectional view of FIG. 3, taking the first glass chip 150 as in FIG. 1B, there is shown on one planar surface of the glass chip the conductive wires forming the looped, multi-turn, planar inductor element 155. Additionally shown formed on the one surface of the glass chip 150 the conductive structures forming capacitor plates 161, 162 of the decoupling capacitor. Further, as shown in the side, cross-sectional view of FIG. 3, there is formed on the glass substrate 150 at least the lead line(s) 154 that is(are) brought out to a top surface or top planarized edge of the glass substrate 150 and that electrically connect to respective ends of the formed inductor 155 using the formed conductive via connectors 165 (and 167).

Although not shown in FIG. 3, the formed first and second capacitor plates 161, 162 connect with a respective parallel oriented lead line (not shown) that is also formed embedded within the substrate near or at a surface of the glass chip 150 and brought out to a top surface or top planarized edge of the glass substrate and that electrically connect to logic die circuitry via respective solder bumps. As shown in FIG. 1B, the glass substrate 150 is oriented vertically at an angle with respect to the orthogonal.

In the embodiment shown in FIG. 3, the first glass chip 150 includes a first magnetic plate 191 adjacent one planar surface including the planar inductor element 155 and first capacitor plate 161, and a second magnetic plate 192 adjacent the other planar surface including the wire leads 154 and any other elements formed on the opposing surface. Although not shown, there can be disposed the middle post of magnetic material, e.g., ferrite, extending through the opening formed in the glass chip corresponding to an area in the middle of the inner loop of the inductor element 155. Further not shown, there can be disposed on the opposing side edges of the glass chip 150 the side magnetic posts that are juxtaposed with edges of the first and second magnetic material plates 191, 192.

In the embodiments depicted in FIGS. 2A-3, and in any other of the embodiments depicted herein, the planar magnetic sheets 191, 192 are provided to limit the spatial extent of the magnetic fields, e.g., created by the inductor, and to thereby provide magnetic shielding between this first inductor and other adjacent inductors, magnetic circuits or electrical circuits in an array of connected inductors such as shown in FIG. 3.

Further, in the embodiment shown in FIGS. 2A-3, and in any other of the embodiments depicted herein, a first set of one or more posts 195 of magnetic material is oriented with the axis of each post 195 perpendicular to the plane of the first inductor's windings 185, wherein the one or more posts in this first set pass through the plane of the inductor windings in an area interior to the path circumscribed by the inductor windings. A further second set of one or more posts 196, 197 of magnetic material is oriented with the axis of each post perpendicular to the plane of the first inductor's windings, wherein the one or more posts in this second set pass through the plane of the inductor windings in an area exterior to the path circumscribed by the inductor windings, wherein sections of magnetic material are located in the planar regions adjacent to the first and second faces of the plane of the first inductor chip, and wherein the interior posts, exterior posts and adjacent planar sections together form one or more loops of magnetic material that encircle the path of current through the inductor windings and wherein this loop of magnetic material increases the inductance of the inductor relative to a similar inductor structure having no magnetic material.

Figure 4:
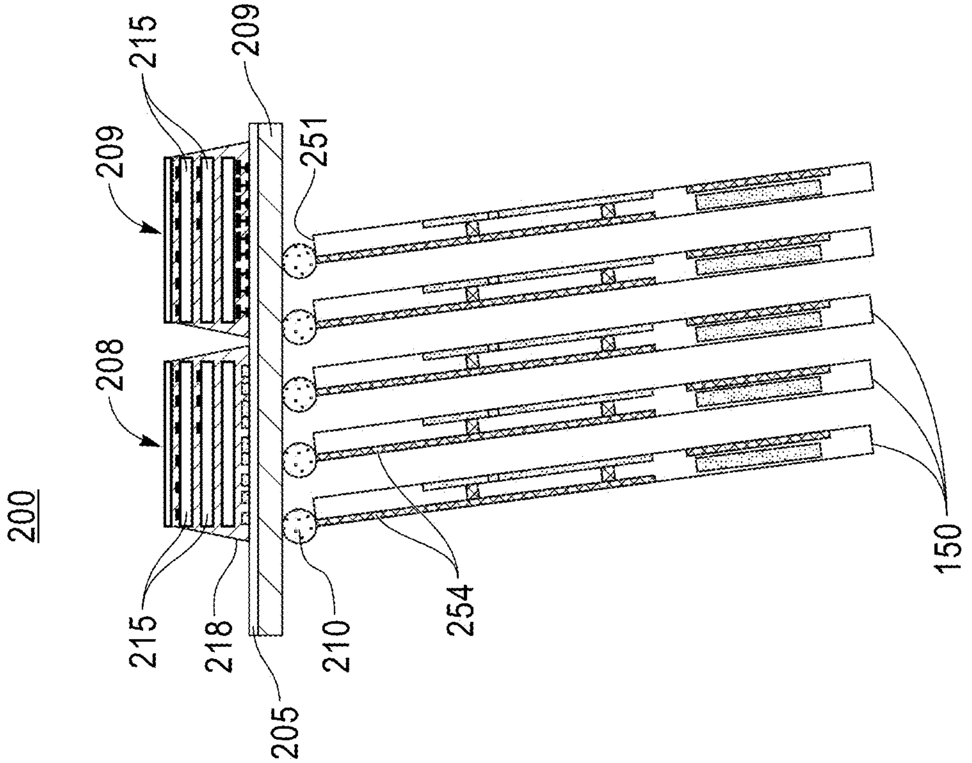
FIG. 4 shows a front elevational view of another embodiment of a logic chip structure and layout including circuit connections between a plurality of inductors on substrates (e.g., glass chips) inclined at some angle θ (angle is less than 90° and greater than 0°) and plural 3D chip or chiplet stacks disposed above (or below) it.

FIG. 4 shows a front elevational view of another embodiment of a logic chip structure and layout 200 including circuit connections between a plurality of inductors on substrates (e.g., glass chips) inclined at some angle θ (angle is less than 90° and greater than 0°) and plural 3D chip or chiplet stacks disposed above (or below) it. For example, FIG. 4 shows a substrate or chip carrier or "interposer" or laminate substrate 205 having two structures 208, each structure including a 3D stack 215 of chips or chiplets. The 3D stacked chip structure 208 can include chips/chiplets including, but not limited to logic chips, processors, ASICs, a 3D memory cube including plural memory chips, and include dielectric fill material 218 for mechanical support. Formed underneath the bottommost chip at each stack 208 are respective conductive pads (not shown) and respective conductors or conductive through vias (not shown) are disposed through the laminate or substrate 205 that connect with respective conductive pads and solder or C4 bumps 210 below the laminate or substrate surface. Each solder or C4 bumps 210 connects to a conductor 254 that is exposed at a top planarized edge 251 of the glass chip or substrate 150. Each glass chip 150 can include one or more inductors and capacitors such as shown in the embodiment of FIGS. 1A, 1B. The glass chips 150 are disposed below the laminate or interposer substrate 205 and at angle θ with respect to a vertical.

As in the embodiments of FIGS. 1A, 1*i*, although the glass substrate is disposed at an angle relative to the vertical, the inductor height on the substrate can be optimized, e.g., for prioritizing a signal delivery. Further, the total area occupied by the angled substrates/inductors is less than 50% of the area occupied by an equivalent in-plane inductor. Further, although not shown, a layout of conductors and wiring in the interposer 205 can be configured to provide power delivery and signal delivery between inductors.

Figure 5:
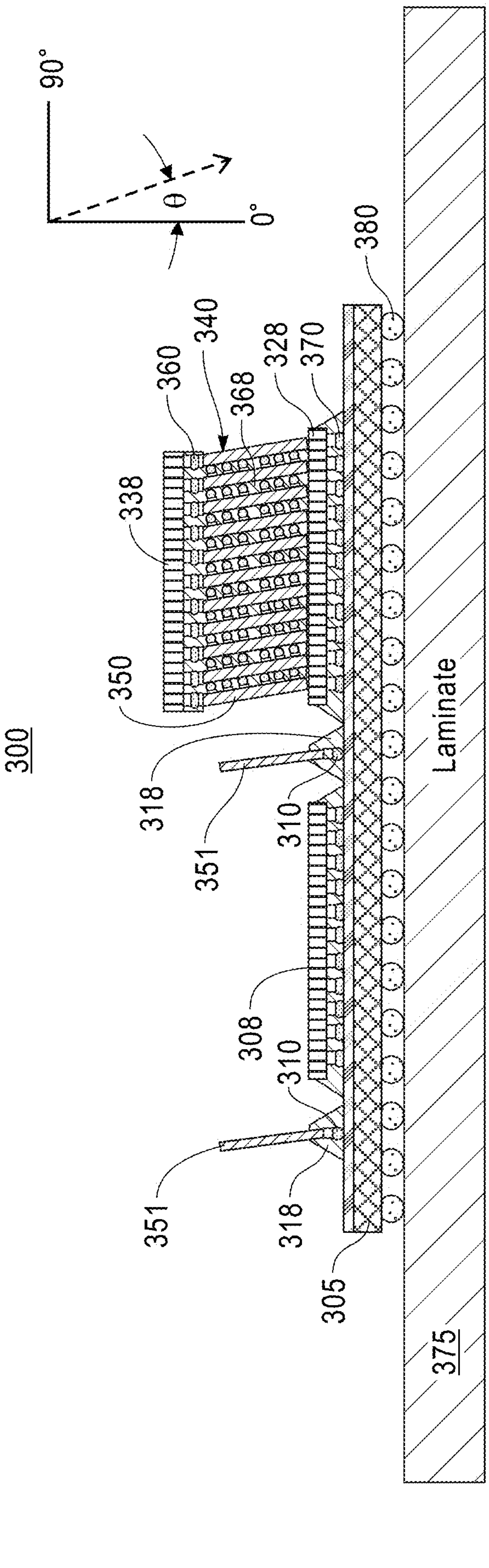
FIG. 5 shows a front elevational view of a further embodiment of a logic chip structure and layout including one or more chips having circuit connections to a plurality of stand-alone glass substrates (e.g., glass chips) having planar inductor(s) and/or capacitor(s) built thereon and that is disposed at an incline at some angle θ that ranges from between 0° and 90° (i.e., 0°<θ<90°) relative to a vertical axis.

FIG. 5 shows a front elevational view of a further embodiment of a logic chip structure and layout 300 including one or more chips having circuit connections to a plurality of stand-alone glass substrates (e.g., glass chips) 351 having inductor(s) and/or capacitor(s) built thereon and that is disposed at an incline at some angle θ that ranges from between 0° and 90° (i.e., 0°<θ<90°) relative to a vertical axis. In the layout 300 of FIG. 5, there is a Silicon (Si) interposer or similar substrate structure 305 having a surface upon which is formed several components including a planar chip(s)/chiplet(s) 308 oriented horizontally on the interposer surface. In embodiments, the planar chip/chiplet 308 can connect to one or more stand-alone inductors formed on one or more respective stand-alone glass substrates 351 that are disposed adjacent to the planar chip 308 and mechanically supported by a fill material. The chip/chiplet structure 308 can include, but is not-limited to, a logic chip, a processor such as a graphics processing unit (GPU) or central processing unit (CPU), an ASIC, a memory chip and can be encompassed by dielectric fill material 318 for mechanical support. In this embodiment, conductive structures (not shown) are provided in the interposer 305 that can connect an aligned bottom pad and solder bump or ball formed at the chip 308 to a further ball or solder bump 310 connected to an inductor lead wire exposed at a planarized edge of the glass substrates (not shown) disposed at an angle relative to the vertical as shown. Increased support for each angled stand-alone glass chip 351 including the inductors (and/or capacitors) is provided by a dielectric fill material 318 that can enhance thermal conductivity and mechanical stability to improve bonding of the angled glass substrate and inductor to the interposer 305. Such fill material 318 can include a low-expansion filler in a polymer substance that can be cured to a solid composite with a desired coefficient of thermal expansion (CTE) value and can fill completely underneath the planar chip 308 and the fill 318 can be deposited to form up a sidewall at each surface of the glass chip 351 having formed inductor or capacitor thereon.

As further shown in the logic chip structure and layout 300 of FIG. 5, formed on the surface of interposer 305 is a further planar and horizontally oriented chip/chiplet structure 328 and a corresponding overlayed horizontally oriented chip/chiplet structure 338 formed adjacent to the stand-alone angled glass substrate 351. Disposed between and electrically connecting to exposed conductors at the chip/chiplet 328, 338 is an array 340 of angled, parallel aligned glass chip substrates 350 each having one or more inductor(s) and/or capacitor elements formed thereon as in the embodiment shown in FIGS. 1A, 1B. In the non-limiting embodiment shown in FIG. 5, each of the formed inductors (not shown) on an angled glass substrate 350 include conductive leads that run up and are exposed at a planarized edge surface of the glass substrate 350 for electrical connection to the further chip 338 via an exposed pad or like under-bump metallurgy and corresponding solder ball or bump 360. In an embodiment, disposed within the space defined by the top chip/chiplet structure 338 and bottom chip/chiplet structure 328 and further disposed between adjacent chips 350 is an underfill (dielectric) material 368, e.g., an epoxy resin, applied to fill the gap between the inclined chips 350 to enhance mechanical support/stability and reliability. Further disposed horizontally between two adjacent glass substrates can be further conductive structures to connect a respective inductor(s) (or capacitors) formed on one glass substrate 350 to another inductor(s) on an adjacent glass substrate 350. In an embodiment, the angled inductors on glass chips can be bonded to each other by adhesive and/or solder interconnect or Cu Hybrid Bonding. Alternatively, the angled inductors on glass chips can be bonded to each other by high thermal conductivity adhesive and/or thermal interconnects (solder interconnect or Cu Hybrid Bonding) when the thermal management is prioritized.

The array 340 of angled glass chip substrates 350 each having one or more inductor(s) and/or capacitor elements formed thereon as in FIGS. 1A, 1B can be separately assembled between the one or more chip/chiplet structures 328, 338 and the whole assembly subsequently attached to the interposer 305 at aligned conducting pad and solder ball structures 370 via a solder reflow process.

As further shown in the logic chip structure and layout 300 of FIG. 5, the Si interposer 305 can be mechanically joined to a surface of a substrate or laminate, e.g., organic laminate substrate (laminate) 375. The interposer and laminate 375 can be formed with conductive pads and/or solder bumps 380 on a top surface thereof that can interface with conductors (not shown) within the interposer 305 and the laminate 375 for providing power and logic signals to and from the logic chips on the interposer and/or other elements supported by the interposer 305.

Figure 6:
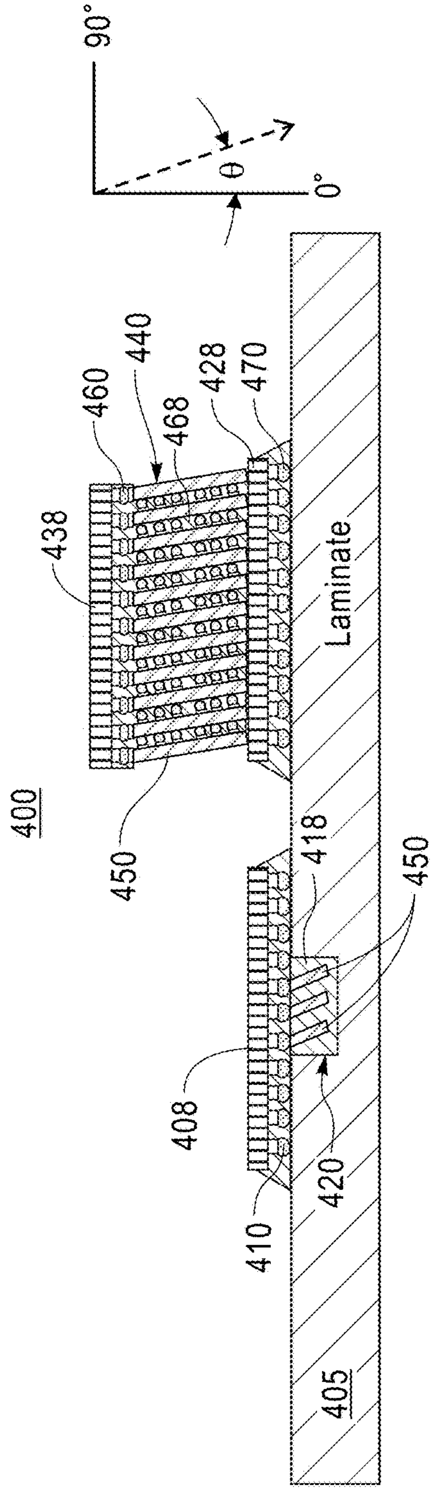
FIG. 6 shows a front elevational view of a further embodiment of a logic chip structure and layout 400 that includes an organic laminate structure 405 having a cavity 420 within which is disposed one or more embedded glass substrates 450 in an angled orientation, each glass substrate formed with one or more inductor(s) and/or capacitors built thereon such as shown in the embodiment of FIGS. 1A, 1B.

FIG. 6 shows a front elevational view of a further embodiment of a logic chip structure and layout 400 that includes an organic laminate structure 405 having a cavity 420 within which is disposed one or more embedded glass substrates 450 in an angled orientation, each glass substrate formed with one or more inductor(s) and/or capacitors built thereon such as shown in the embodiment of FIGS. 1A, 1B. Overlying the top of the cavity 420 and connected at the surface of the laminate 405 is a single, planar-oriented logic chip 408 having one or more underlying pad/solder ball connections 410 that are aligned with and connect to exposed conductors (not shown) at the surface of the laminate 405. In the embodiment of FIG. 6, one or more of the underlying pad/solder ball connections 410 at single chip 408 are joined to an exposed conductor at a planarized surface edge of a respective angled glass substrates (e.g., glass chips) 450 such as shown in the embodiment of FIGS. 1A, 1B. Each of the angled glass substrates (e.g., glass chips) 450 having one or more inductor(s) built thereon extend downward within the cavity 420 formed in the laminate and each glass substrate is disposed at an incline at some vertical angle θ ranging from between 0° and 90° (i.e., 0°<θ<90°) relative to a vertical. The cavity 450 can be filled with a dielectric fill material 418 that can enhance thermal conductivity and provide increased mechanical stability for each angled glass substrate 450 including the inductors (and/or capacitors) within the cavity.

In the layout 400 of FIG. 6, the planar chip/chiplet 408 can include, but is not-limited to, a logic chip, a processor, an ASIC, a memory chip and can communicate with one or more chips of a 3D stack of logic chips located adjacent to the planar oriented single chip 408. For example, in the further embodiment of FIG. 6, formed on the surface of laminate 405 is a further planar and horizontally oriented chip/chiplet structure 428 and a corresponding overlayed horizontally oriented chip/chiplet structure 438 formed adjacent to the planar oriented single chip 408. Disposed between and electrically connecting to exposed conductors at the under surface of chip/chiplet 428 and the undersurface of top chip/chiplet 438 is an array 440 of multiple angled, parallel-aligned glass chip substrates 450 each having one or more inductor(s) and/or capacitor elements formed thereon and inclined at an angle "θ" as in the embodiment of FIGS. 1A, 1B. In the non-limiting embodiment shown in FIG. 6, each of the formed inductors (not shown) on an angled glass substrate 450 include conductive leads that run up and are exposed at a planarized edge surface of the glass substrate 450 for electrical connection to the further chip 438 via an exposed pad and corresponding solder ball or bump 460. In an embodiment, disposed within the space defined by the top chip/chiplet structure 438 and bottom chip/chiplet structure 428 is a dielectric fill material 468 for mechanical support/stability. Further disposed horizontally between two adjacent glass substrates can be further conductive structures to connect a respective inductor(s) (or capacitors) formed on one glass substrate 450 to another inductor(s) on an adjacent glass substrate 450. The array 440 of angled glass chip substrates 450 each having one or more inductor(s) and/or capacitor elements formed thereon as in FIGS. 1A, 1B can be assembled and connected between the one or more chip/chiplet structures 428, 438 in a separate semiconductor manufacturing process, and the whole assembly subsequently attached to the laminate 405 at aligned conducting pad and solder ball structures 470 via a solder reflow process.

Figure 7:
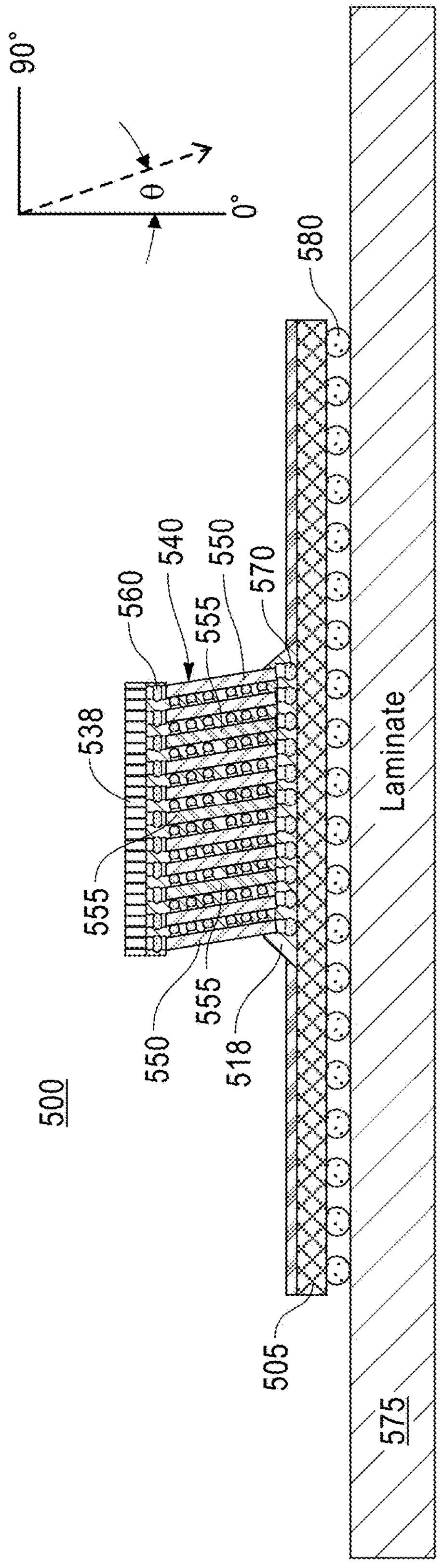
FIG. 7 shows a front elevational view of a further embodiment of a logic chip structure and layout including a top logic chip having circuit connections to one or more inductor(s) and/or capacitors formed on a plurality of glass substrates (e.g., glass chips) disposed in an array of glass substrates that are inclined at some angle θ that ranges from between 0° and 90° (i.e., 0°<θ<90°) relative to a vertical axis.

FIG. 7 shows a front elevational view of a further embodiment of a logic chip structure and layout 500 including a top logic chip 538 having circuit connections to one or more inductor(s) and/or capacitors formed on a plurality of glass substrates (e.g., glass chips) 550 disposed in an array 540 of glass substrates that are inclined at some angle θ that ranges from between 0° and 90° (i.e., 0°<θ<90°) relative to a vertical axis. Further disposed in the array 540 of inclined glass substrates and electrically and mechanically connected to overlying planar top chip(s)/chiplet(s) 538 are one or more memory chips 555, i.e., substrates having semiconductor memory elements for storing data formed thereon that further connect to circuitry (not shown) in the chip 538. A memory chip 555 can consist of a memory die including one or more memory chips with each chip having one or more memory banks each including one or more levels of circuitry, e.g., memory cells, transistors, etc.

More particularly, in the layout 500 of FIG. 7, connected at the surface of the Silicon (Si) interposer or like substrate structure 505 is the array 540 of glass substrates 550 and memory chips 555 that mechanically and electrically connect to aligned conductive pads/solder bumps 570 that can connect to circuitry in the interposer and further mechanically and electrically connect to aligned conductive pads/solder bumps 560 to connect to circuitry (not shown) at the overlying planar top chip(s)/chiplet(s) 538. The chip/chiplet structure 538 can include, but is not-limited to, a logic chip, a processor, an ASIC, and the array 540 and chip 538 structure can be further supported and reinforced by dielectric fill material 518 for mechanical support. Such dielectric fill material 518 can enhance thermal conductivity and mechanical stability to improve bonding of the respective angled inductor or capacitor at the glass substrate 550 and the angled memory chips 555 to the interposer 505.

As further shown in FIG. 7, disposed between and electrically connecting to exposed conductors at the chip/chiplet 538 is the array 540 of angled, parallel aligned glass chip substrates 550 each having one or more inductor(s) and/or capacitor elements formed thereon as in FIGS. 1A, 1B and additionally the interspersed similarly angled memory chips 555. In the non-limiting embodiment shown in FIG. 7, each of the formed inductors (not shown) on an angled glass substrate 550 include conductive leads that run up and are exposed at a planarized edge surface of the glass substrate 550 for electrical connection to the chip 538 via an exposed pad and corresponding solder ball or bump 560. In an embodiment, disposed within the space defined by the top chip/chiplet structure 538 and interposer structure 505 is a dielectric fill material for enhanced mechanical support/stability. Further disposed horizontally between two adjacent angled glass substrates and/or disposed between an angled glass substrate 550 and an adjacent memory chip 555 can be further conductive structures to connect a respective inductor(s) (or capacitors) formed on one glass substrate 550 to a connector to a circuit formed at the adjacent memory chip 555. The array 540 of angled glass chip substrates 550 each having one or more inductor(s) and/or capacitor elements formed thereon as in FIGS. 1A, 1B and interspersed with one or more memory chips 555 can be separately assembled to connect to the chip/chiplet structure 538 and the whole assembly subsequently attached to the interposer 505 at aligned conducting pad and solder ball structures 570 via a solder reflow process.

In this embodiment, conductive structures, e.g., such as through silicon vias (TSVs) (not shown) are provided in the interposer 505 that can connect to an aligned bottom pad and solder bump or ball 570 formed at the surface of interposer 505 and such bottom pad and solder bump or ball 570 can connect to an inductor lead wire exposed at a planarized edge of the glass substrates (not shown) that are disposed at an angle relative to the vertical as shown in the embodiment of FIGS. 1A, 1B.

As further shown in the logic chip structure and layout 500 of FIG. 7, the Si interposer 505 can be mechanically joined to a surface of a substrate or laminate, e.g., organic laminate (laminate) 575. The interposer 505 and laminate 575 can be formed with conductive pads and/or solder bumps 580 on a top surface thereof that can interface with conductors (not shown) within the interposer 505 and the laminate 575 for providing power and logic signals to and from the logic chip 538 and memory chip 555.

Figure 8:
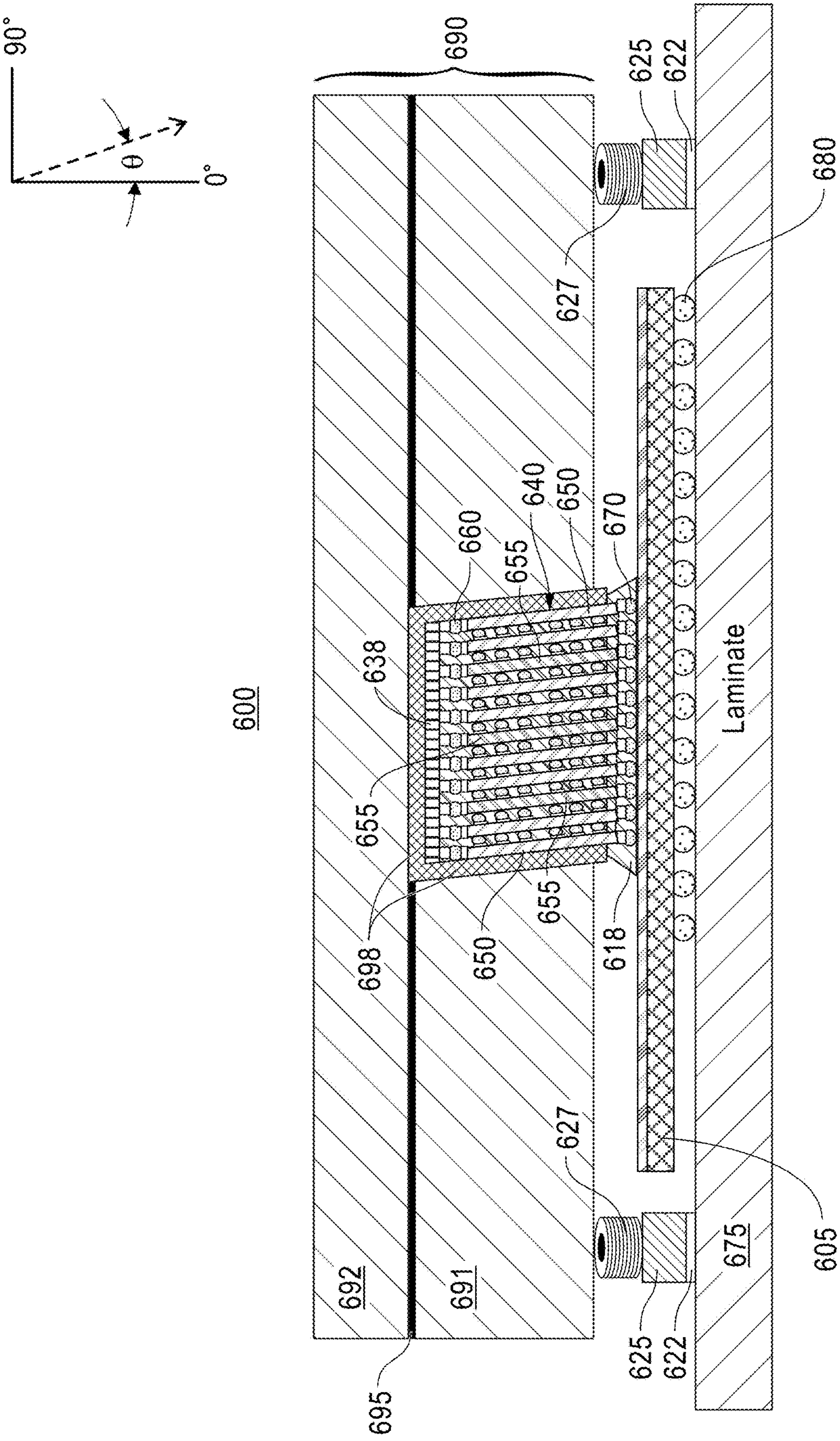
FIG. 8 shows a front elevational view of a further embodiment of a logic chip structure and layout corresponding to the structure shown in the embodiment depicted in FIG. 7 however including a heat spreader(s), silicon chips, and thermal interconnects for thermal conductivity enhancement.

FIG. 8 shows a front elevational view of a further embodiment of a logic chip structure and layout 600 corresponding to the structure 500 shown in the embodiment depicted in FIG. 7 however including a heat spreader(s), silicon chips, and thermal interconnects for thermal conductivity enhancement. In this embodiment, the logic chip structure and layout 600 includes a top logic chip 638 having circuit connections to one or more inductor(s) and/or capacitors formed on a plurality of Si or glass substrates 650 disposed in an array 640 of substrates that are each inclined at some vertical angle θ ranging anywhere from between 0° and 90° (i.e., 0°<θ<90°) relative to a vertical. Further disposed in the array 640 of inclined Si or glass substrates and electrically and mechanically connected to overlying planar top chip(s)/chiplet(s) 638 are one or more memory chips 655, i.e., substrates having semiconductor memory elements formed thereon that further connects to circuitry (not shown) in the chip 638.

More particularly, in the layout 600 of FIG. 8, connected at the surface of the Silicon (Si) interposer or like substrate structure 605 is the array 640 of Si substrates 650 and memory chips 655 that mechanically and electrically connect to aligned conductive pads/solder bumps 670 that can further connect to circuitry in the interposer and further mechanically and electrically connect to aligned conductive pads/solder bumps 660 to connect to circuitry (not shown) at the overlying planar top chip(s)/chiplet(s) 638. The chip/chiplet structure 638 can include, but is not limited to, a logic chip, a processor such as a GPU or CPU, an ASIC, and the array 640 and chip 638 structure can be further supported and reinforced by dielectric fill material 618 for mechanical support. Such dielectric fill material 618 can enhance thermal conductivity and mechanical stability to improve bonding of the respective angled inductor or capacitor at the Si substrate 650 and the angled memory chips 655 to the interposer 605.

As further shown in FIG. 8, disposed between and electrically connecting to exposed conductors at the chip/chiplet 638 is the array 640 of angled, parallel aligned Si chip or insulating substrates 650 each having one or more inductor (s) and/or capacitor elements formed thereon as in FIGS. 1A, 1B and additionally the interspersed similarly angled memory chips 655. In the non-limiting embodiment shown in FIG. 8, each of the formed inductors (not shown) on an angled substrate 650 include conductive leads that run up and are exposed at a planarized edge surface of the substrate 650 for electrical connection to the chip 638 via an exposed pad and corresponding solder ball or bump 660. In an embodiment, disposed within the space defined by the top chip/chiplet structure 638 and interposer structure 605 is a dielectric fill material for enhanced mechanical support/stability. Further disposed horizontally between two adjacent angled Si substrates 650 and/or disposed between an angled Si substrate 650 and an adjacent memory chip 655 can be further thermal interconnect structures 645. The array 640 of angled Si chip substrates 650 each having one or more inductor(s) and/or capacitor elements formed thereon as in FIGS. 1A, 1B and interspersed with one or more memory chips 655 can be separately assembled to connect to the chip/chiplet structure 638 and the whole assembly subsequently attached to the interposer 605 at aligned conducting pad and solder ball structures 670 via a solder reflow process.

As further shown in FIG. 8, a heat spreader or heat sink assembly 690 is fabricated that includes a first heat spreader structure 691 that laterally surrounds and contacts the assembly including logic chip 638 and angled chip array 640 and a second heat spreader structure 692 that overlies the first heat spreader structure 691 and contacts a surface of the top chip 638. As shown in FIG. 8, the first heat spreader 691 and overlying second heat spreader structure 692 can be adhesively bonded to each other by a thin thermally conductive adhesive layer 695 to provide a final heat spreader assembly that wholly surrounds the angled chips. In a further embodiment, there can be first applied a thermal interface material (TIM) layer 698, e.g., thermal paste or adhesive, to surround the 3D logic chip layout structure 600 in order to enhance the thermal coupling between the top chip 638 and the connected inclined/angled chips 650, 655 having inductors and/or memory dies, and the formed heat spreader 690. The attached heat spreader 690 can be any tungsten- or molybdenum-based heat dissipating material known in the art and is formed to cover the TIM layer 698 of the 3Dlogic chip structure 600.

As further shown in FIG. 8, the Si interposer 605 including the logic chip structure 600 formed with surrounding heat spreader 690, can be mechanically joined to a surface of a substrate or laminate, e.g., organic laminate 675. The interposer 605 and laminate 675 can be formed with conductive pads and/or solder bumps 680 on a top surface thereof that can interface with conductors (not shown) within the interposer 605 and the laminate 675 for providing power and logic signals to and from the logic chip 638 and Si substrates 650 and memory chips 655. The laminate 675 can be fabricated to include a sealband 622 that includes a support structure 625 surrounding the periphery of the interposer 605 and which includes a spring 627 formed on a surface thereof for contacting the underside of the heat spreader 691 to provide flexible support thereof and form a seal with the heat spreader 690.

Similarly, the logic chip structure 600 is of a small form factor and can include a heat spreader 41 formed on the carrier or interposer 605.

Figure 9A:
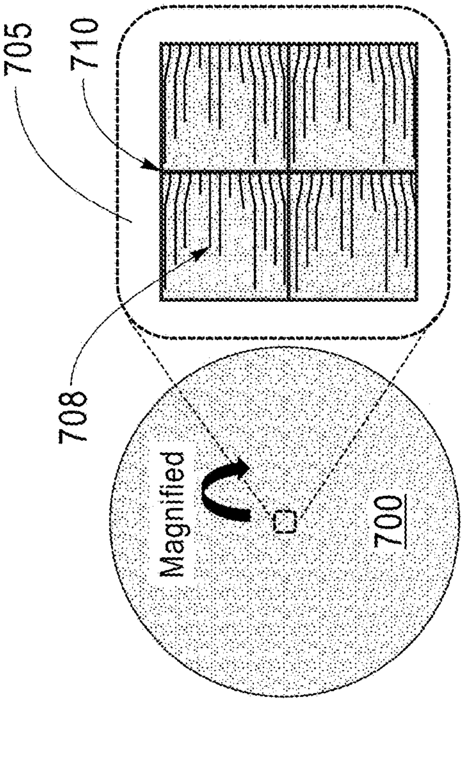
FIGS. 9A-9H depicts an exemplary process for fabricating a semiconductor structure including a logic chip and attached angled glass chips and formed planar inductors thereon according to embodiments herein.

FIGS. 9A-9H depict an exemplary process for fabricating a 3D semiconductor apparatus including a logic chip and attached angled inductors according to embodiments herein. As shown in FIG. 9A, there is depicted a semiconductor or insulating material wafer 700, e.g., a glass wafer, having fabricated thereon planar inductors and capacitors and conductors according to embodiments herein. As further depicted in FIG. 9A, there is shown a magnified view of a wafer portion 705 which includes a layer of wiring metal, e.g., Cu, a conductor(s) 708 that extends to one line of each glass chip on the glass wafer with inductors and capacitors. The magnified view shown in FIG. 9A depicts four sections, separated by a dicing line 710.

Figure 9B:
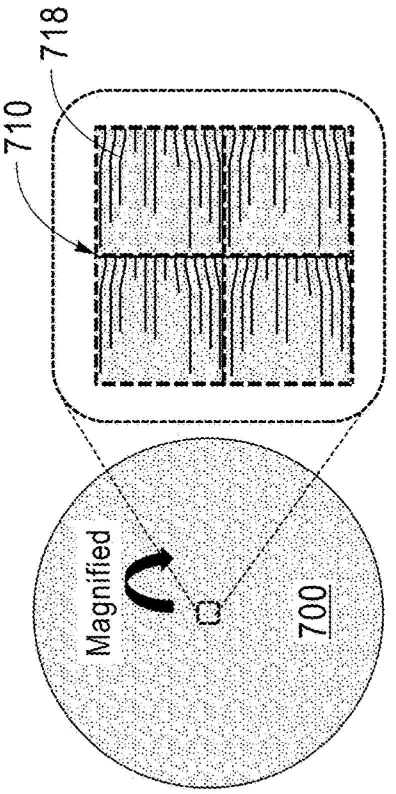

FIG. 9B shows a resulting structure 715 of each chip on the glass wafer 700 after a dicing operation along dicing lines 710 performed according to known techniques in an embodiment to form individual glass chips 718 that include formed planar inductors capacitors and the conductor structures.

Figure 9C:
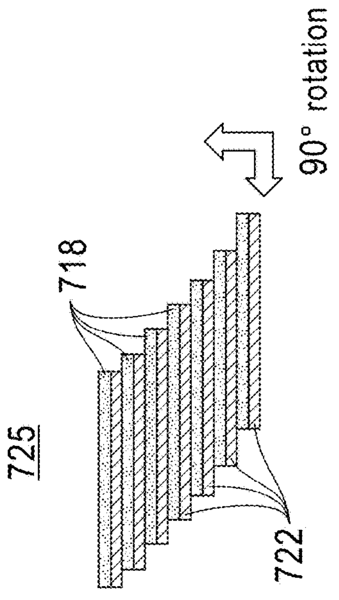

FIG. 9C shows a resulting structure 725 after an offset stacking procedure in which the individual diced glass chips 718 with inductors and capacitors from the glass wafer 700 are stacked in a staggered or offset manner and bonded together by adhesive bonding, hybrid bonding or thermal compression bonding (solder bonding). As shown in FIG. 9C, each glass chip 718 is separated by a gap therebetween. In an embodiment, the gap needs to be precisely controlled. There is provided in one embodiment, a plurality dummy bumps formed as dummy bump layers 722 for controlling the gap distance between glass chips.

Figure 9D:
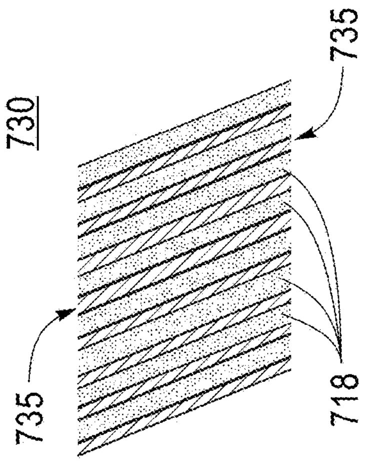

FIG. 9D shows a resulting structure 730 resulting from rotating the stack 725 of offset diced glass chips of FIG. 9C by 900 after the offset stacking procedure. If needed, the lateral surface, e.g., top and/or bottom surface(s) 735 of the stacked glass chips 718 can be planarized, e.g., by mechanical polishing. As a result of the rotating, each of the glass chips having inductors formed thereon are oriented at an angle, i.e., inclined with respect to a vertical axis.

Figure 9E:
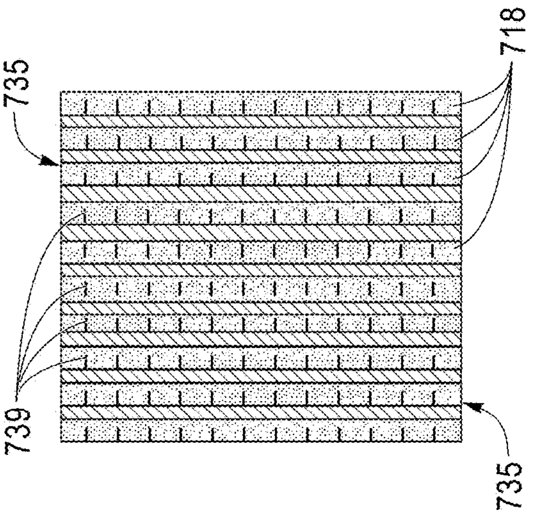

FIG. 9E shows a resulting structure after fabricating conductor structures or traces 739 on top the planarized surface, e.g., top surface, bottom planarized surface or both top and bottom planarized surfaces 735.

Figure 9F:
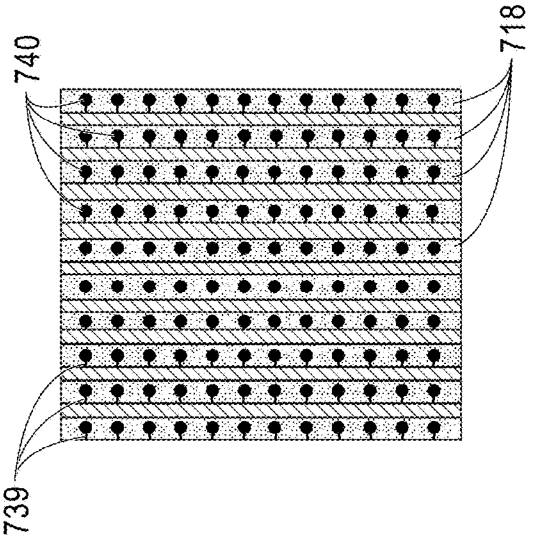

FIG. 9F shows a resulting structure after fabricating solder bump interconnections 740 on the planarized surface, e.g., top surface, bottom planarized surface or both top and bottom planarized surfaces. As shown in FIG. 9E, the planarized top edge or bottom edge of the glass chips 718 include a formed conductor trace 739 and a corresponding connected solder bump interconnections 740 that can form under bump structures (interconnectors). In an embodiment, the bumping 740 on the planarized lateral surfaces 735, for example is conducted by electroplating or IMS (Injection Molded Soldering). In addition to solder interconnect, Cu hybrid bonding is an alternative.

Figure 9G:
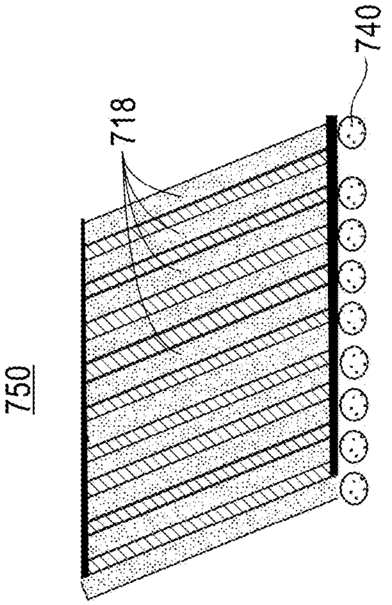
Figure 9H:
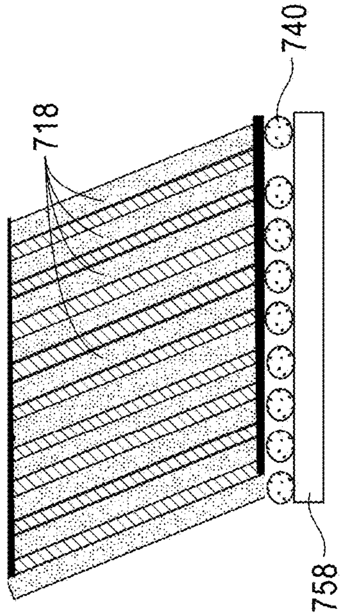

FIG. 9G shows a resulting structure 750 after the stacked glass chips with inductors and capacitors as in FIG. 9F are rotated again by 90 degrees for subsequent bonding to a fabricated logic chip/chiplet or like integrated circuit (IC) 758 such as a graphics processing unit (GPU) or central processing unit (CPU) which is already formed mounted on and electrically connected an Si-interposer or substrate in embodiments herein. FIG. 9H shows the bonding of the stacked-glass-chips to the logic die, e.g., GPU or CPU 758. depicting the assembly of glass chips with the inductors and capacitors and logic.

It is understood that the structure 750 shown in FIGS. 9G and 9H can be further subject to a dispensing of an underfill material to reinforce the bonding of the angled inductors and capacitors on the glass substrates to the logic die 758.

In additional embodiments, a manufacturing of a single inductor unit as shown in the embodiments herein involves steps including but not limited to: 1) creating a planar insulating structure such as glass chip 150 however, this could be a silicon chip, a section of an organic laminate and could be thinned (e.g., ground) to a desired thickness. It could also be milled to a desired area; 2) depositing one or more conductor (copper) layers onto one or both faces of the insulating structure using standard semiconductor lithographic manufacturing techniques; then 3) patterning, using lithographic techniques such as depositing photoresist and then etching, the copper into a top and a bottom coil. The coil features may extend all the way to the edge of the structure's faces, in order to facilitate electrical contact to future contact balls; then 4) drilling and plating to create a through-insulator via that electrically connects the top and bottom coils, in order to create one continuous coil or winding. During the plating process the sidewalls of the insulating structure may be plated, in order to connect the top and bottom surface coils to metal on the peripheral edge; 5) Etching or milling holes or cuts in the insulator structure, to permit future insertion of magnetic posts through the holes or slots. During the milling procedure the peripheral edge may be milled, in order to isolate regions of the peripheral edge one from the other, in order to isolate contact regions for future contact balls; 6) Creating a first magnetic plate 191, a second magnetic plate 192 and three magnetic posts such as magnetic posts 195, 196, 197. These could be pre-made from co-fired ferrite and subsequently ground to precise dimensions. The magnetic posts 195, 196, 197 could be made as a single unit with one of the magnetic plates (and E-core) or could be separate. A magnetic gap could also be created, either by making one of the posts shorter than the others or by creating nonmagnetic posts that are placed in series with the magnetic posts; 7) Assembling the magnetic structures (two plates 191, 192 and two or more posts 195-197, usually three posts) onto the formed intermediate insulator substrate and formed copper inductor structures. Note that the steps 6) and 7) could be combined, by depositing the magnetic material onto the formed intermediate insulator and copper structure. If the magnetic structures in step 6 are fabricated separately from the formed intermediate insulator and copper structure, then a glue or other adhesive may be used to hold the magnetic structures (including the gapping features) to the formed intermediate insulator and copper structure; and 8) Adding contact balls. This may involve adding solder paste or other conductive material to the edge periphery contact regions, depositing contact balls onto these contact regions and heating in an oven to promote adhesion. Conductive glue could alternatively be used. Note that it may be advantageous to delay the addition of contact balls until after multiple single inductor units are assembled together.

In a further embodiment, a method for assembling multiple inductor units as an array, at an angle, e.g., as shown in the embodiments herein, includes steps of 1) Laying a first inductor unit onto the glass substrate; 2) Optionally laying an insulating sheet on top of the first inductor unit (alternatively, direct contact between magnetic materials may be permitted, with only moderate functional degradation); 3) Laying a second inductor unit onto the first inductor unit. Laterally offset the second unit from the first, in order to create the desired angle in the final array; 4) Repeating these steps until the desired array size is obtained. Adhesive may be used during each step or at the end, in order to hold the layers of the array together; 5) Adding contact balls and turn the array so that the contact edges of each inductor unit are exposed at a top planar surface of the array. This can include light grinding as needed, in order to create a planar surface for contact ball deposition. Then depositing adhesive (liquid solder paste), contact balls and adhere (such as by heating in oven); 6) Verifying a lateral positioning of contact balls; and 7) Testing the electrical connectivity and magnetic inductance of each inductor (including mutual inductance).

The embodiments herein address a critical challenge of energy saving in semiconductor packages. Resonant clocking in semiconductor global clock networks is an example for energy saving. In conventional resonant clocking, all the components (inductors, and capacitors) are fabricated on a Si chip or on a Si In-Plane chip. In that case, a large area is occupied by inductors and capacitors, and a dielectric layer is necessary between Si and inductors and capacitors. In the embodiments herein, inductors and capacitors are fabricated on a glass chips, which are placed inclined at an angle (angle is less than 90° and greater than 0°) relative to the functional chip (a logic chip) above or below it. It leads to increase of the capacity of inductors in the unit area, adjacent to a functional chip. In an embodiment, the area occupied is less than 50% of the area occupied by the equivalent in-plane inductor. In additional embodiments, the inductors can additionally support clocking on functional chips, power rails on functional chips, voltage regulations and buck converters. By angling the insulating substrates and fabricated planar metal coil inductors formed thereon, the present disclosure promotes the ability to trade-off chip volume versus chip area.

While the figures herein illustratively demonstrate exemplary structures and processing steps, according to specific embodiments of the present invention, it is clear that a person ordinarily skilled in the art can readily modify such structures or process steps for adaptation to specific application requirements, consistent with the above descriptions.

It should therefore be recognized that the present invention is not limited to the specific embodiment illustrated hereinabove, but rather extends in utility to any other modification, variation, application, and embodiment, and accordingly all such other modifications, variations, applications, and embodiments are to be regarded as being within the spirit and scope of the invention.

What is claimed is:

1. An apparatus comprising:

an insulating substrate having an edge and a first planar surface;

a looped planar metal coil forming an inductor on said first planar surface, the inductor coil having opposite ends, each opposite end of said looped metal inductor coil having a respective conductive wire trace extending to an edge of the insulating substrate;

a horizontally planar-oriented integrated circuit (IC) chip or chiplet having conductive connective pads; and each the conductive wire trace of said insulating substrate edge adapted to electrically connect to a respective connective pad via a conductive connector, wherein the insulating substrate and formed inductor thereon is disposed vertically with respect to the horizontally planar-oriented IC chip and is inclined at an angle with respect to a vertical axis, wherein the angle ranges between less than 90 degrees and greater than 0 degrees.

2. The apparatus of claim 1, wherein the conductive wire trace extends up a second planar surface of the insulating substrate, an end of the looped metal inductor coil on the first planar surface connecting to the conductive wire trace extending up a second planar surface using a conductive via connection.

3. The apparatus of claim 2, further including: a first magnetic material plate disposed adjacent the inductor looped metal coil at the first planar surface; and a second magnetic material plate disposed adjacent the second planar surface, each first and second plate extending to respective side edges of the respective first and second planar surfaces of said insulating substrate.

4. The apparatus of claim 3, further comprising: a further magnetic material plate disposed at first and second side edges of said insulating substrate and connecting said first and second magnetic plates to form an enclosure.

5. The apparatus of claim 3, wherein said insulating substrate includes an opening formed at an area within and defined by an inner loop of the looped metal coil inductor, said apparatus further comprising:

a post of magnetic material disposed through said formed opening the magnetic material post connecting said first magnetic material plate and said second material plate.

6. The apparatus of claim 2, wherein the inductor formed on said insulating substrate is disposed below the horizontal planar-oriented IC chip or chiplet, the conductive wire trace of said insulating substrate edge connecting to a connective pad using a conductive bump connector.

7. The apparatus of claim 2, wherein the inductor formed on said insulating substrate is disposed above the horizontal planar-oriented IC chip or chiplet, the conductive wire trace of said insulating substrate edge connecting to a connective pad using a conductive bump connector.

8. The apparatus of claim 2, further comprising:

an interposer substrate, upon which is physically mounted said horizontal planar-oriented IC chip or chiplet, wherein the inductor formed on said insulating substrate is disposed adjacent said horizontal planar-oriented IC chip or chiplet, the conductive wire trace of said insulating substrate edge electrically connecting to a connective pad via a conductive bump connector and a conductive metal wire structure formed in said interposer.

9. The apparatus of claim 2, further comprising:

a laminate structure upon which is mounted said interposer for electrical connection therewith via one or more conductive bump connections.

10. The apparatus of claim 2, wherein said insulating substrate further comprises: a capacitor having a first capacitor plate and a second capacitor plate formed at or near the first or a second planar surface plate, the first and second capacitor plates having a respective conductive wire trace extending to an edge of the insulating substrate for electrical connection to a respective connective pad of said IC chip or chiplet.

11. The apparatus of claim 2, wherein said insulating substrate further comprises: additional looped planar metal coils forming respective additional inductors formed on a planar surface of said insulating substrate, each additional formed inductor coil having opposite ends, each opposite end of said looped planar metal inductor coil having a respective conductive wire trace extending to an edge of the insulating substrate for electrical connection to a respective connective pad of said IC chip or chiplet.

12. An apparatus comprising:

a laminate structure having a surface for mounting integrated circuits;

a cavity formed in said laminate structure, said cavity having an opening at the surface of said laminate:

a horizontally planar-oriented IC chip or chiplet mounted on said laminate, said mounted IC chip or chiplet having a portion disposed above the cavity including an underside surface having one or more exposed conductive connector structures that connect to circuitry in the IC chip or chiplet;

one or more insulating substrates disposed in said cavity; and one or more inductors formed on a surface of said insulating substrate, each inductor comprising a looped planar metal coil formed on a surface of said insulating substrate; each metal coil inductor comprising opposite ends, each opposing end of said looped metal inductor coil having a respective conductive wire trace extending to an edge of the insulating substrate;

wherein the conductive wire trace of a respective said insulating substrate edge electrically connects to a respective conductive connector structure of said mounted IC chip or chiplet at the underside surface thereof, wherein the insulating substrate and formed inductor thereon is disposed vertically with respect to the horizontally planar-oriented IC chip and is inclined at an angle with respect to a vertical axis, wherein the angle ranges between less than 90 degrees and greater than 0 degrees.

13. The apparatus as claimed in claim 12, further comprising:

a three-dimensional semiconductor device structure mounted on said laminate structure adjacent the horizontally planar-oriented IC chip or chiplet, the three-dimensional semiconductor device structure comprising:

a top horizontal planar-oriented IC chip or chiplet having one or more conductive bump connectors on an underside surface thereof;

a bottom horizontal planar-oriented IC chip or chiplet having one or more conductive bump connectors on a top surface thereof;

a plurality of insulating substrates having a planar surface upon which is formed one or more planar looped metal coil inductors, each of the plurality of insulating substrates having said formed inductors oriented vertically and arranged in a parallel and adjacent each other in a series configuration, the plurality of insulating substrates sandwiched between the top horizontal planar-oriented IC chip or chiplet and top surface of said laminate bottom horizontal planar-oriented IC chip or chiplet, wherein each looped planar metal coil inductor comprises opposite ends, each opposing end of said looped metal coil inductor having a respective conductive wire trace extending to a top or bottom edge of the insulating substrate; and a respective wire trace at a surface edge of the insulating substrate electrically connecting to a corresponding conductive bump structure formed at the underside surface of said top horizontal planar-oriented IC chip or chiplet for connecting to a circuit within said top horizontal planar-oriented IC chip or chiplet or electrically connecting to a corresponding conductive bump structure formed at a top surface of said laminate structure, wherein the insulating substrate and formed inductor thereon is disposed vertically with respect to the horizontally planar-oriented IC chip and is inclined at an angle with respect to a vertical axis, wherein the angle ranges between less than 90 degrees and greater than 0 degrees.

14. The apparatus as claimed in claim 13, wherein the bottom horizontal planar-oriented IC chip or chiplet of said three-dimensional structure comprises conductive bump connections on an underside surface thereof, wherein the laminate comprises conductive connector structures on a surface of the laminate, said conductive bump connections on an underside surface of the bottom horizontal planar-oriented IC chip or chiplet connected to a corresponding conductive bump structure formed at a surface said laminate structure.

15. A three-dimensional semiconductor device structure comprising:

a top horizontal planar-oriented logic chip or chiplet having one or more conductive bump connectors on an underside surface thereof, a plurality of insulating substrates having a planar surface upon which is formed one or more planar looped metal coil inductors, each of the plurality of insulating substrates having said formed inductors oriented vertically and arranged in parallel and adjacent each other in a series configuration, wherein each looped planar metal coil inductor comprises opposite ends, each opposing end of said looped metal coil inductor having a respective conductive wire trace extending to a top edge of the insulating substrate; and a respective wire trace at a surface edge of the insulating substrate electrically connecting to a corresponding conductive bump structure formed at the underside surface of said top horizontal planar-oriented logic chip or chiplet for connecting to a circuit within said top horizontal planar-oriented logic chip or chiplet wherein each inductor is formed on a respective insulating substrate is disposed vertically with respect to the horizontally planar-oriented logic chip and is inclined at an angle with respect to a vertical axis, wherein the angle ranges between less than 90 degrees and greater than 0 degrees.

16. The three-dimensional semiconductor device structure of claim 15, further comprising:

a first magnetic material plate disposed adjacent the inductor looped metal coil at the first planar surface; and a second magnetic material plate disposed adjacent the second planar surface, each first and second plate extending to respective side edges of the respective first and second planar surfaces of said insulating substrate.

17. The three-dimensional semiconductor device structure of claim 15, further comprising:

one or more semiconductor memory slices interspersed between the plurality of insulating substrates and adjacent an insulating substrate in the series configuration, each memory slice having a substrate and one or more memory elements disposed thereon for storing data, a memory slice having one or more further conductive wire traces extending to a top edge of the substrate; and a respective further wire trace at a surface edge of the substrate electrically connecting to a corresponding conductive bump structure formed at the underside surface of said top horizontal planar-oriented logic chip or chiplet, wherein each one or more semiconductor memory slice is disposed vertically with respect to the horizontally planar-oriented logic chip and is inclined at an angle with respect to a vertical axis, wherein the angle ranges between less than 90 degrees and greater than 0 degrees.

18. The three-dimensional semiconductor device structure of claim 15, wherein the conductive wire trace extends up a second planar surface of the insulating substrate, an end of the looped metal inductor coil on the first planar surface connecting to the conductive wire trace extending up a second planar surface using a conductive via connection.

19. The three-dimensional semiconductor device structure of claim 15, further comprising:

an interposer substrate mounted on a laminate structure and having electrical connectors on an underside surface thereof for electrical connection to corresponding conductive bump connectors at a surface of said laminate structure and having conductive material connectors on a top surface thereof that connect to the electrical connectors on the underside surface thereof, wherein each looped planar metal coil inductor comprises opposite ends, an opposing end of said looped metal coil inductor having a respective conductive wire trace extending to a bottom edge of the insulating substrate, a respective wire trace at the bottom edge of the insulating substrate electrically connecting to a corresponding conductive material connector formed at the top surface of said laminate structure.

20. The three-dimensional semiconductor device structure of claim 15, further comprising:

a heat spreader structure substantially surrounding the top horizontal planar-oriented logic chip or chiplet and the plurality of insulating substrates having a planar surface upon which is formed one or more planar looped metal coil inductors, the heat spreader including a seal band on said laminate supporting said heat spreader structure above the laminate and interposer.

* * * * *